(12) United States Patent
Padullaparthi

(10) Patent No.: US 9,014,225 B2
(45) Date of Patent: Apr. 21, 2015

(54) VERTICAL CAVITY SURFACE EMITTING LASER DEVICE

(71) Applicant: SAE Magnetics (H.K.) Ltd., Hong Kong (CN)

(72) Inventor: Babu Dayal Padullaparthi, Hong Kong (CN)

(73) Assignee: SAE Magnetics (H.K.) Ltd., Hong Kong (CN)

( * ) Notice: Subject to any disclaimer, the term of this patent is extended or adjusted under 35 U.S.C. 154(b) by 0 days.

(21) Appl. No.: 14/030,363

(22) Filed: Sep. 18, 2013

(65) Prior Publication Data

US 2015/0078410 A1 Mar. 19, 2015

(51) Int. Cl.
*H01S 3/04* (2006.01)
*H01S 3/042* (2006.01)

(52) U.S. Cl.
CPC ..................... *H01S 3/042* (2013.01)

(58) Field of Classification Search
CPC ... H01S 5/0425; H01S 5/18311; H01S 5/423;
H01S 5/02476; H01S 5/183; H01S 5/02469;
H01S 5/34306; H01S 5/18; H01S 5/187
USPC ............... 372/34, 43.01, 50.1, 50.11, 50.124, 372/46.013, 45.01
See application file for complete search history.

(56) References Cited

U.S. PATENT DOCUMENTS

| | | | |
|---|---|---|---|
| 6,717,974 B2 * | 4/2004 | Zhang | 372/96 |
| 7,539,229 B2 * | 5/2009 | Kim et al. | 372/46.01 |
| 8,831,058 B2 * | 9/2014 | Morel et al. | 372/34 |
| 2005/0271113 A1 | 12/2005 | Song et al. | |
| 2006/0274805 A1 * | 12/2006 | Song et al. | 372/50.124 |
| 2008/0056321 A1 * | 3/2008 | Motomura et al. | 372/45.01 |
| 2010/0118907 A1 | 5/2010 | Sato et al. | |
| 2011/0280269 A1 * | 11/2011 | Chang-Hasnain et al. | 372/50.1 |
| 2013/0083304 A1 * | 4/2013 | Kondo et al. | 355/55 |

FOREIGN PATENT DOCUMENTS

JP  2007-311617  11/2007

* cited by examiner

*Primary Examiner* — Colleen A Matthews
*Assistant Examiner* — Delma R Forde
(74) *Attorney, Agent, or Firm* — Nixon & Vanderhye PC

(57) ABSTRACT

A vertical cavity surface emitting laser (VCSEL) device includes a bottom distributed Bragg reflector (DBR); a top DBR; an optical cavity with an active layer stack formed between the bottom DBR and the top DBR, arranged for generating light with a predetermined emission wavelength; a top electrode layer with a first window formed above the top DBR; and a first heat dissipation layer sandwiched between the top DBR and the top electrode layer. The VCSEL device utilizes thicker, heavily doped semiconductor contact window for efficient heat dissipation from active region. Besides heat dissipation on the top side of VCSEL device, it also increases the bandwidth of VCSEL through top DBR reflectivity changes that reduce the photon lifetime via a surface relief structure etching on the top side of VCSEL device. Further, the invented VCSEL contains adjusted Aluminum molefractions in multiple sections of top and bottom DBRs to effectively dissipate heat from active region of VCSEL. Thus, proposed VCSEL device maintains lower junction temperature for achieving stable high-speed operations at high ambient temperature, thereby improving its performance.

16 Claims, 14 Drawing Sheets

Non-planar mesa

VERTICAL CAVITY SURFACE EMITTING LASER DEVICE

FIELD OF THE INVENTION

The present invention relates to a vertical cavity surface emitting laser (VCSEL), and more particularly to an improved VCSEL device.

BACKGROUND OF THE INVENTION

A VCSEL is a semiconductor laser that emits light in a vertical direction with respect to a substrate. In general VCSEL have an active layer with a large gain, a low threshold current, high optical power, reliability, and adequately controlled polarization. Since the VCSEL does not require a cleavage process, it allows to be integrated into two-dimensional arrays for on-wafer testing. It is suitably used in various consumer applications such as the light source of an image forming apparatus, the light source of an optical pickup device, the optical communication data transmitter of optical interconnections and optical modules, etc.

Optical modules made with VCSELs have potential applications in high-speed transmission of light. Generally, the optical power, optical spectrum, and end of life time of a semiconductor laser are affected by the degree of heat generation resulting from current injection. It is particularly noted that since the VCSEL has its active layer arranged between two semiconductor multilayer reflector (DBR: Distributed Bragg Reflector) mirrors that have high thermal resistance, significant temperature increase may occur in the active layer, and due to this higher junction temperature of the VCSELs in comparison to the optical module heat generated components like CDR etc, the performance of VCSEL will be seriously degraded.

Accordingly, techniques have been proposed for controlling such temperature increase in the active layer of the VCSEL. US Patent Publication No. 2005/0271113 A1 discloses a VCSEL 100 as shown in FIG. 1. The VCSEL 100 includes a top DBR 120 and a bottom DBR 130 sandwiching an active region 140. The top and bottom DBRs 120, 130 and the active region 140 are fabricated on a substrate 150. A top electrode 154 is connected to the top reflector 120 while a bottom electrode 152 is connected to the substrate. The active region 140 includes a light generation layer 142 which is typically constructed from one or more quantum wells of In Gallium Arsenide (GaAs), Aluminum Arsenide (AlAs), Aluminum Gallium Arsenide (AlGaAs), or Indium Aluminum Gallium Arsenide (InAlGaAs). The light generation layer 142 is configured to generate light having a known wavelength. When the current is applied to the electrodes 152, 154, then flows through the active region 140, photons are generated by the quantum wells of the light generation layer 142. Light is reflected back and forth between the DBRs 120 and 130, finally a portion light is transmitted through the DBR 120 and out of a contact window 156 in the top electrical contact, which is indicated by arrow 158.

To generate more light from the VCSEL 100, more current is applied to the VCSEL 100, which brings more heat generated at the active region 140. Accordingly, to facilitate dissipation of heat produced by the active region 140, a high thermal conductivity layer 102 is fabricated between the active region 140 and the bottom DBR 130. Particularly, the high thermal conductivity layer 102 is made of AlAs, which has a high optical transparency and has relatively higher thermal conductivity compared to the thermal conductivity of the DBRs 120 and 130. Therefore the high thermal conductivity layer 102 facilities the removal of and dissipation of heat from the active region 140.

However, when the VCSEL 100 is operated with high current for long durations, it's hard to dissipate all heat generated by the active region 140 and as a result, high junction temperature may cause unstable operation of the VCSEL 100 at higher ambient temperature, which reduces the performance of the VCSEL 100. On the other hand, a portion of heat also will transmit to the top DBR 120 and heat will be present on the electrodes 154 due to the injected current herein, which is congregated on the top side of the VCSEL 100, especially on the top surface of the top DBR 120.

Thus, it is desired to provide an improved VCSEL with high heat dissipation efficiency, and manufacturing method thereof to overcome the above-mentioned drawbacks.

SUMMARY OF THE INVENTION

One objective of the present invention is to provide a VCSEL device to maintain lower junction temperature for achieving stable operation at high ambient temperature, thereby improving performance of the VCSEL device.

To achieve above objective, the inventors propose a structure of making a VCSEL device that includes a bottom DBR; a top DBR; an active layer formed between the bottom DBR and the top DBR, arranged for generating laser light with a predetermined emission wavelength; at least one oxide section formed between DBR and active layer, a top electrode layer with a first window formed above the top DBR; and a first heat dissipation layer sandwiched between the top DBR and the top electrode layer.

As an embodiment of the present invention, the first heat dissipation layer includes one or more material(s) selected from a group consisting of Aluminum Arsenide, Gallium Arsenide, Gallium Indium Arsenide and Indium Phosphide.

As a preferred embodiment of the present invention, further includes a surface relief structure which includes a central notch formed on a center of the surface of the first heat dissipation layer. The depth of the central notch is in a range of $0.02\lambda$ to $0.25\%\lambda$, where $\lambda$ is the emission wavelength of the laser light in vacuum; and the diameter of the central notch is in a range of 1 μm to 6 μm.

As another preferred embodiment of the present invention, further includes a surface relief structure includes at least one annular groove surrounding a central portion of the surface of the first heat dissipation layer. The depth of the annular groove is in a range of $0.02\lambda$ to $0.25\lambda$, where $\lambda$ is the emission wavelength of the laser light in vacuum; and the width of the annular groove is in a range of 1 μm to 6 μm.

When transverse modes are transmitting on the area having the surface relief structure with optimized depth and diameter, reflectivity of the modes will change, the photon lifetime is effectively controlled, and the −3 dB bandwidth of the VCSEL device is increased for high-speed operations. By optimizing the surface relief structure, the spectral line width of VCSEL device is reduced which greatly helps to increase signal transmission to longer distances.

As a preferable embodiment, the VCSEL device further includes a contact layer formed between the top electrode layer and the first heat dissipation layer, and a graded index layer formed between the top distributed Bragg reflector and the first heat dissipation layer.

Preferably, a relationship below is satisfied:

$T = n*(\frac{1}{4})\lambda$; where $\lambda$ is the emission wavelength of the laser light in vacuum, T is a total thickness of the first heat dissipation layer, the contact layer and the graded index layer, and n is a natural number.

Preferably, peripheral portions of the contact layer, the first heat dissipation layer and the graded index layer are selectively removed by etching. Based on the arrangement, uniform current will be injected to the oxide section of the current limiting layer, thus uniform higher order transverse modes injection can be achieved and threshold current density for the higher order transverse modes is reduced. As a result, the higher order transverse modes would be most efficiently reflected while fundamental mode will be less reflected.

Preferably, the oxide section includes at least two phase matching layers (preferably three phase matching layers) and a current limiting layer (made of oxide) sandwiched between the top DBR and light generating active layer. And an oxide window/aperture (a second window) is opened on the current limiting layer, and the diameter of the second window is of the order of diameter of top contact window (the first window). For efficient high speed operation, a VCSEL structure can also use two current limiting layers in two individual oxide sections because, the addition of a second current limiting layer decreases mesa capacitance and hence increases the bandwidth and speed of VCSEL.

More preferably, the VCSEL device further includes a second heat dissipation layer formed between the active layer and the bottom distributed Bragg reflector, or between the active layer and the top distributed Bragg reflector.

Optionally, the bottom DBR is n-type doping reflector or p-type doping reflector, and the top DBR has an opposite polarity doping reflector.

Optionally, the predetermined emission wavelength comprises 780 nm, 850 nm, 980 nm, 1060 nm, 1330 nm, or 1550 nm.

Preferably, further includes a substrate which is made of p-doped, n-doped or un-doped materials formed beneath the bottom DBR.

As another embodiment, the predetermined emission wavelength comprises 850 nm, and the top DBR comprises: a first section A formed of multiple pairs, each of which is stacked by a low refractive index layer of $Al_xGa_{1-x}As$ ($0.90 \leq x \leq 0.92$) and a high refractive index layer of $Al_xGa_{1-x}As$ layer ($0.05 \leq x \leq 0.15$); and a second section B formed of multiple pairs, each of which is stacked by a low refractive index layer of $Al_xGa_{1-x}As$ ($0.90 \leq x \leq 1.0$) and a high refractive index layer of $Al_xGa_{1-x}As$ layer ($0.05 \leq x \leq 0.15$). The bottom DBR comprises: a first section C formed of multiple pairs, each of which is stacked by a low refractive index layer of $Al_xGa_{1-x}As$ ($0.90 \leq x \leq 0.92$) and a high refractive index layer of $Al_xGa_{1-x}As$ layer ($0.05 \leq x \leq 0.15$); and a second section D formed of multiple pairs, each of which is stacked by a low refractive index layer of $Al_xGa_{1-x}As$ ($0.90 \leq x \leq 0.92$) and a high refractive index layer of $Al_xGa_{1-x}As$ layer ($0.05 \leq x \leq 0.15$).

As one more embodiment, the predetermined emission wavelength comprises 1060 nm, and the top DBR comprises: a first section A formed of multiple pairs, each of which is stacked by a low refractive index layer of $Al_xGa_{1-x}As$ ($0.90 \leq x \leq 0.92$) and a high refractive index layer of $Al_xGa_{1-x}As$ layer ($0 \leq x \leq 0.12$); and a second section B formed of multiple pairs, each of which is stacked by a low refractive index layer of $Al_xGa_{1-x}As$ ($0.91 \leq x \leq 1.0$) and a high refractive index layer of $Al_xGa_{1-x}As$ layer ($0 \leq x \leq 0.12$). The bottom DBR comprises: a first section C formed of multiple pairs, each of which is stacked by a low refractive index layer of $Al_xGa_{1-x}As$ ($0.90 \leq x \leq 0.92$) and a high refractive index layer of $Al_xGa_{1-x}As$ layer ($0 \leq x \leq 0.12$); and a second section D formed of multiple pairs, each of which is stacked by a low refractive index layer of $Al_xGa_{1-x}As$ ($0.90 \leq x \leq 1.0$) and a high refractive index layer of $Al_xGa_{1-x}As$ layer ($0.0 \leq x \leq 0.12$).

In comparison with the prior art, as the present invention provides a first heat dissipation layer sandwiched between the top DBR and the top electrode layer, thus heat generated on the top electrode due to long duration of applied current, and heat congregated on the top side of the VCSEL device, especially on the top surface of the top DBR will be efficiently dissipated. As a result, a lower junction temperature of VCSEL device is maintained, thereby achieving stable operation at high ambient temperature, which improves the performance of the VCSEL device greatly.

Other aspects, features, and advantages of this invention will become apparent from the following detailed description when taken in conjunction with the accompanying drawings, which are a part of this disclosure and which illustrate, by way of example, principles of this invention.

BRIEF DESCRIPTION OF THE DRAWINGS

The accompanying drawings facilitate an understanding of the various embodiments of this invention. In such drawings:

FIG. 4b is a top-view of the VCSEL device shown in FIG. 4a;

FIG. 4c is a cross-sectional view of the partial VCSEL device that shows transverse mode affected by configuration shown in FIG. 4a;

FIG. 5b is a top-view of the VCSEL device shown in FIG. 5a;

FIG. 5c is a cross-sectional view of the partial VCSEL device that shows transverse mode affected by configuration shown in FIG. 5a;

FIGS. 7a and 7b shows two improved embodiments based on the embodiments shown in FIGS. 4a and 4a;

DETAILED DESCRIPTION OF ILLUSTRATED EMBODIMENTS

Figure 1:
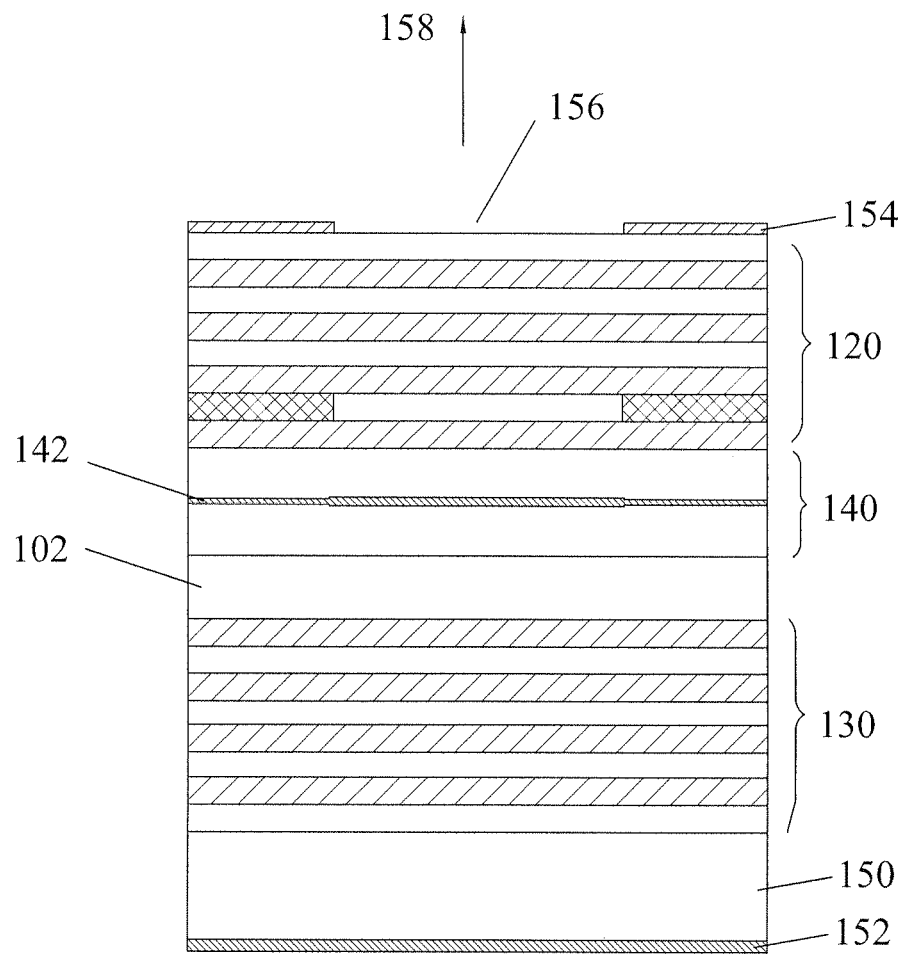
FIG. 1 is a cross-sectional view of a conventional VCSEL.

Various preferred embodiments of the invention will now be described with reference to the figures, wherein like reference numerals designate similar parts throughout the various views. As indicated above, the invention is directed to a VCSEL device with heat dissipation structure to maintain lower junction temperature for achieving stable operation at high ambient temperature, thereby improving performance of the VCSEL device.

Figure 2:
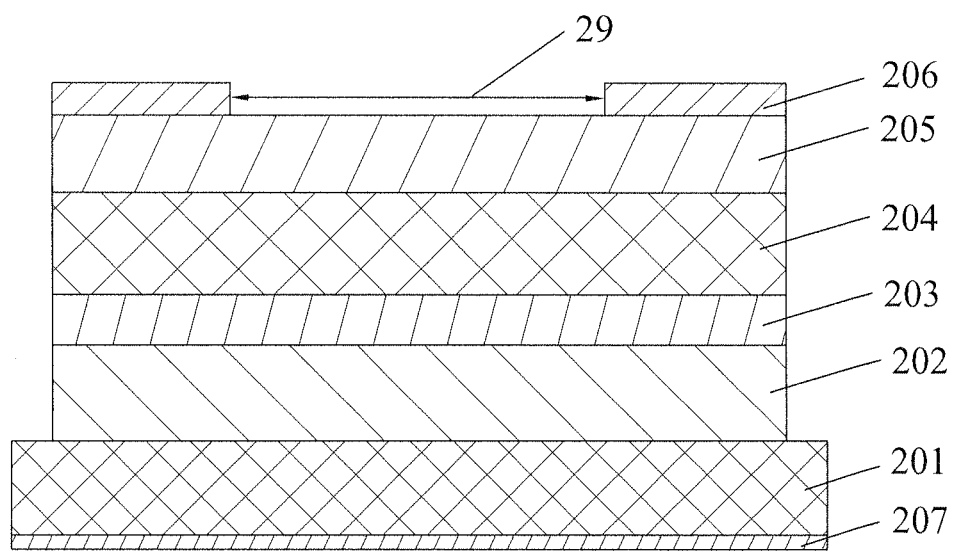
FIG. 2 is a cross-sectional view of a VCSEL device according to a first embodiment of the present invention.

FIG. 2 is a cross-sectional view of a VCSEL device according to a first embodiment of the present invention. The VCSEL device 200 includes a substrate 201, a bottom DBR 202 and a top DBR 204 formed on the substrate 201, an active layer 203 sandwiched between the bottom DBR 202 and top DBR 204 to generate laser light, and a first heat dissipation layer 205 formed on the top DBR 204. A top electrode layer 206 is formed on and electrically connected with the first heat dissipation layer 205, and a bottom electrode layer 207 is formed beneath the substrate 201, which are adapted for applying current to the active layer 203 to generate laser light. A first window 29 is opened in the top electrode layer 206, so as to expose a part of the first heat dissipation layer 205.

The substrate 201 may be n-type GaAs doped with silicon or p-type GaAs doped with silicon. In the present embodiment, the substrate 201 is an n-type GaAs. The bottom electrode layer 207 forms an Ohmic contact to the substrate 201 and is typically made of electrically conductive metal. The substrate can also be un-doped (semi-insulating) GaAs. In this case the bottom electrode layer 207 can also be made present on the top side.

Concretely, the bottom DBR 202 can be n-type reflector or p-type reflector, and the top DBR 204 has the opposite polarity. In the present embodiment, the bottom DBR 202 is an n-type reflector and the top DBR 204 is a p-type reflector. Generally, the bottom and top DBRs 202, and 204 respectively are stacks of layers in different refractive index layers alternately stacked, which are made with materials such as AlAs, GaAs, or AlGaAs having different mole fractions of Aluminum and Gallium. In actual implementations, each of DBR 202 or 204 may includes many layers such as twenty or thirty pairs of layers, or more. Preferably, for the emission wavelength at 850 nm, the bottom DBR 202 is optimized to include stacks of $Al_{0.1}Ga_{0.9}As$ and $Al_{0.92}Ga_{0.08}As$, $Al_{0.05}Ga_{0.95}As$ and $Al_{0.94}Ga_{0.06}As$ or $Al_{0.1}Ga_{0.9}As$ and AlAs. In the case of the emission wavelength at 1060 nm, the bottom DBR 202 is optimized to include stacks of GaAs and AlAs.

The active layer 203 is typically constructed from one or more quantum wells of InGaAs, GaAs, AlGaAs, InAlGaAs, or InGaNAsP. The active layer 203 is configured to generate light having a predetermined emission wavelength. The predetermined emission wavelengths used for optical communication include 780 nm, 850 nm, 980 nm, 1060 nm, 1310 nm, 1550 nm, and particularly, emission wavelengths 850 nm and 1060 nm are preferably used for VCSEL device 200 of the present invention.

When a drive current is applied to the top and bottom electrode layers 206, 207, it flows through the active layer 203, and then laser light is generated in the active layer 203. The laser light is amplified while it is reflected at each interface between layers of top DBR 204 and bottom DBR 202, and is emitted from the first window 29 of the VCSEL device 200 vertically.

With the contemplation of the present invention, the first heat dissipation layer 205 are formed between the top DBR 204 and the top electrode layer 206, and can be made of one or more material(s) selected from a group consisting of AlAs, GaAs, and Indium Phosphide (InP) which have high conductivity, thus heat present on the top electrode layer 206 due to long durations of applied current, and heat congregated on the top side of the VCSEL device 200, specially on the top surface of the top DBR 204 will be dissipated efficiently. As a result, a lower junction temperature of VCSEL device 200 is maintained, thereby achieving stable operation at high ambient temperature, which improves the performance of the VCSEL device 200 greatly.

To achieve a good heat dissipation effect at 850 nm emission wavelength, the heat dissipation window (consisting of layers 205, 209, and 208) with thick first heat dissipation layer 205 is preferably made of $Al_{0.05}Ga_{0.95}As$ with a total thickness of 60~65 nm which has higher thermal conductivity than that of the conventional $Al_{0.15}Ga_{0.85}As$. Under this condition, the heat dissipation effect will be stronger when the bottom DBR 202 also includes stacks of $Al_{0.1}Ga_{0.9}As$ and $Al_{0.92}Ga_{0.08}As$, or $Al_{0.05}Ga_{0.95}As$ and $Al_{0.94}Ga_{0.06}As$.

To achieve a good heat dissipation effect at 1060 nm emission wavelength, the heat dissipation window (consisting of layers 205, 209, 208) with a thick first heat dissipation layer 205 is preferably made of GaAs with a total thickness of 75~80 nm which has excellent thermal conductivity than that of the conventional $Al_{0.15}Ga_{0.85}As$. Under this condition, the heat dissipation effect will be stronger when the bottom DBR 202 also includes stacks of AlAs and GaAs.

Figure 3:
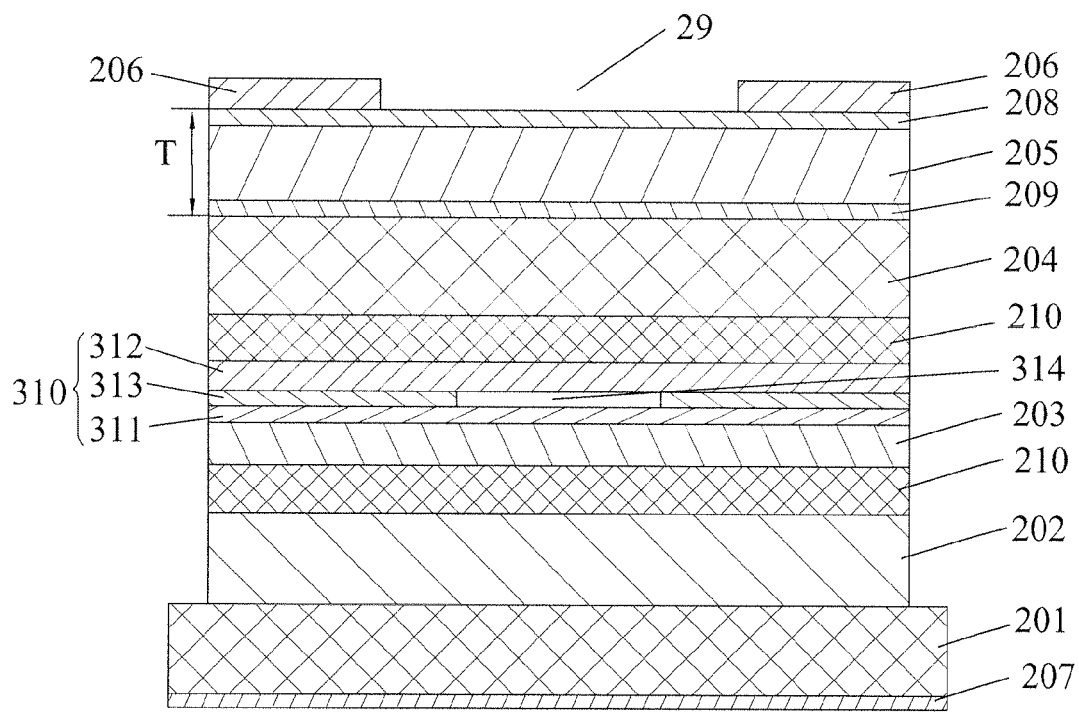
FIG. 3 is a cross-sectional view of a VCSEL device according to a second embodiment of the present invention.

FIG. 3 shows an improved VCSEL device based on the first embodiment shown in FIG. 2. The VCSEL device 300 of FIG. 3 includes many portions that are same as or similar to corresponding portions of the VCSEL device 200 of FIG. 2. For convenience, the same or similar portions are assigned the same reference numerals and different portions are assigned different reference numerals.

Referring to FIG. 3. the VCSEL device 300 further includes a contact layer 208 formed between the top electrode layer 206 and the first heat dissipation layer 205, and a graded index layer 209 formed between the top DBR 204 and the first heat dissipation layer 205. The contact layer 208 is made of GaAs, AlGaAS or InGaAs. The contact layer 208, first heat dissipation layer 205 and graded index layer 209 sandwiched between the top electrode layer 206 and the top DBR 204 creates a light transmission window (called contact window hereinafter) corresponding to the first window 29 opened in the top electrode layer 206, the total thickness T of three layers 208, 205, and 209 (namely the thickness of the first contact window) is satisfied a relationship below: $T=n*(1/4)\lambda$, where $\lambda$ is the emission wavelength of the laser light in vacuum and n is a natural number (n=1, 2, 3, 4, 5, ...).

As an improved embodiment, an oxide section 310 is formed on the active layer 203, and the oxide section 310 includes at least two phase matching layers 311, 312 (in the figures only two phase matching layers are shown) and a current limiting layer 313 sandwiched between the two oxide layers 311, 312 the top DBR and light generating active layer. The current limiting layer 313 is made of oxide and used to direct the electrical current generally toward the middle of the active layer 203. When used, the current limiting layer 313 insulates all but a circular or polygon-shaped window 314 having a diameter being of the order of the diameter of the first window 29. Because most of the electrical current is directed toward the middle of the active layer 203, most of the light is generated within the middle portion of the active layer 203. And the phase matching layers 311, 312 are made of AlGaAs semiconductor with different mole fractions of Al and Ga. For efficient high speed operation, a VCSEL structure can include two individual oxide sections with two current limiting layers because, the addition of second current limiting layer decreases mesa capacitance and hence increases the bandwidth and speed of VCSEL device.

For enhancing heat dissipation efficiency, a second heat dissipation layer 210 can be formed between the active layer 203 and the bottom DBR 202, or between the active layer 203 and the top DBR 204, or two such heat dissipation layers 210 are configured. Moreover, the second heat dissipation layers are also served as phase matching layers.

Figure 4A:
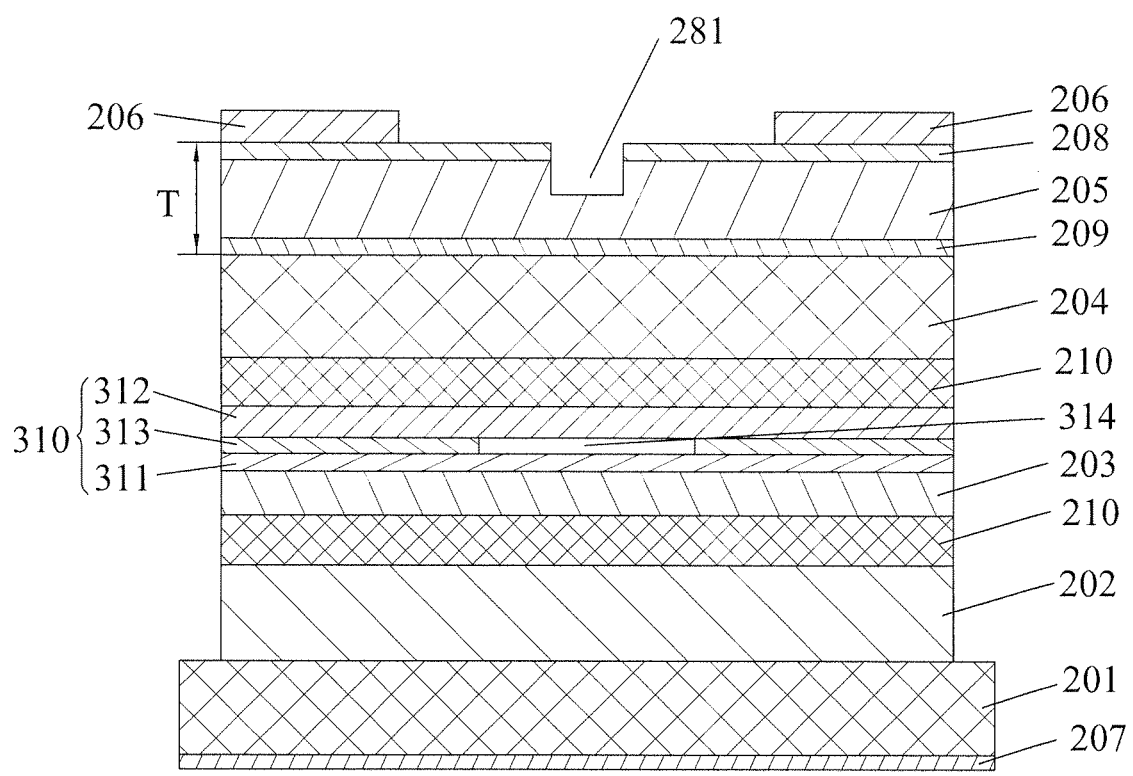
FIG. 4a is a cross-sectional view of a VCSEL device according to a third embodiment of the present invention.
Figure 4B:
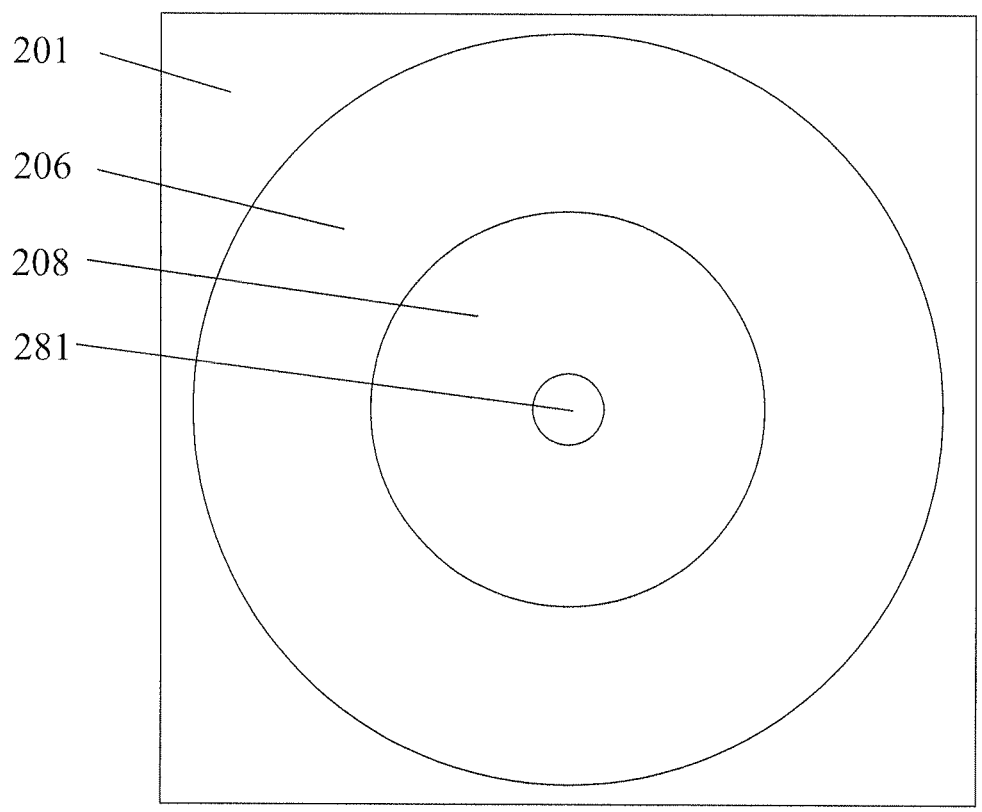

FIG. 4a is a cross-sectional view of a VCSEL device 400 according to a third embodiment of the present invention. FIG. 4b is a top view of the VCSEL device 400 shown in FIG. 4a. The VCSEL device 400 of the present invention is similar to the VCSEL device 300 described above, except minor changes.

Figure 4C:
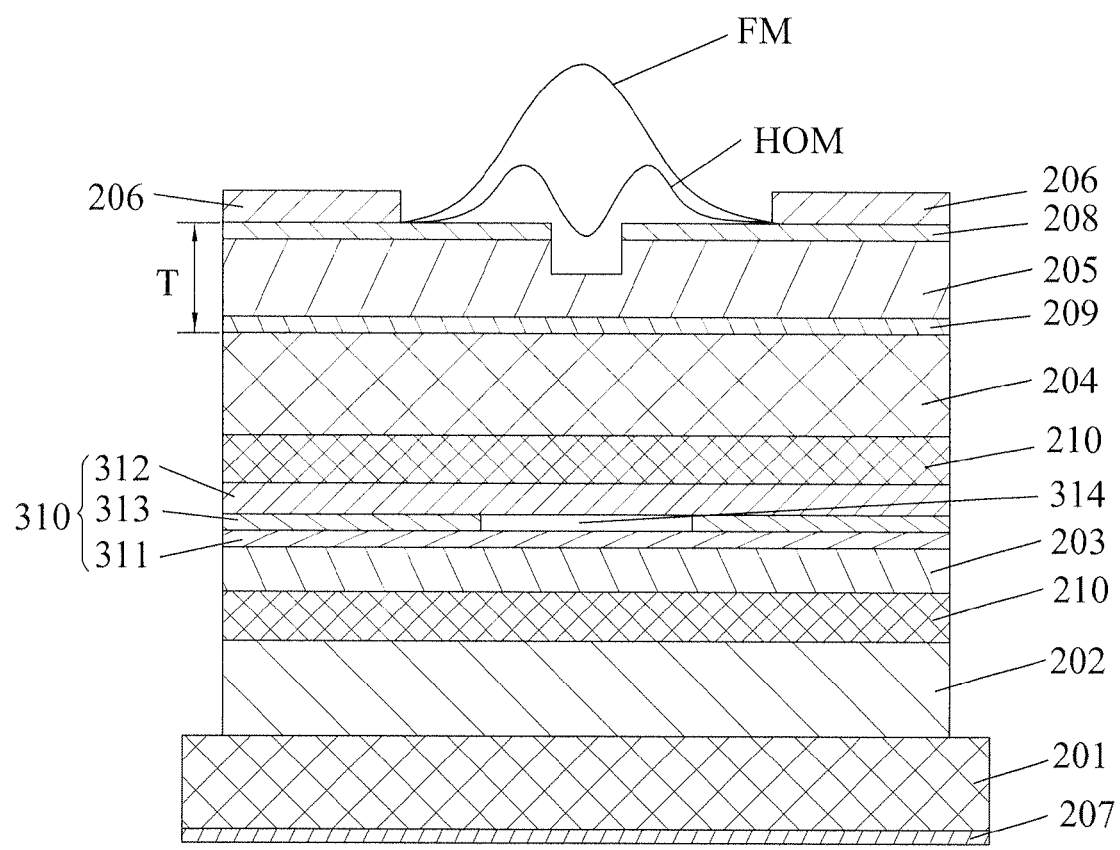

In this embodiment, a surface relief structure is formed on a surface of the first heat dissipation layer 205, so as to increase the ultimate operation speed of the VCSEL device 400. Concretely, the surface relief structure is a central notch 281 formed on a center of the surface of the contact layer and the first heat dissipation layer 205. The shapes of the central notch 281 can be circular or polygonal, which has a diameter in a range of 1 μm~6 μm, while the depth thereof is in a range of $0.02\lambda$~$0.25\lambda$. FIG. 4c is a cross-sectional view of the partial VCSEL device that shows affect generated by the central notch 281 formed on the first heat dissipation layer 205. When the notch 281 is etched on the center of the contact window with a diameter of 3 μm, the coupling loss of the fundamental mode (FM) is lowered, and thus the fundamental mode would be efficiently reflected and, in turn the output power of the fundamental mode is higher. In other words, the coupling loss of the higher order transverse modes (HOM) is increased, thus higher order transverse modes are suppressed.

Figure 5A:
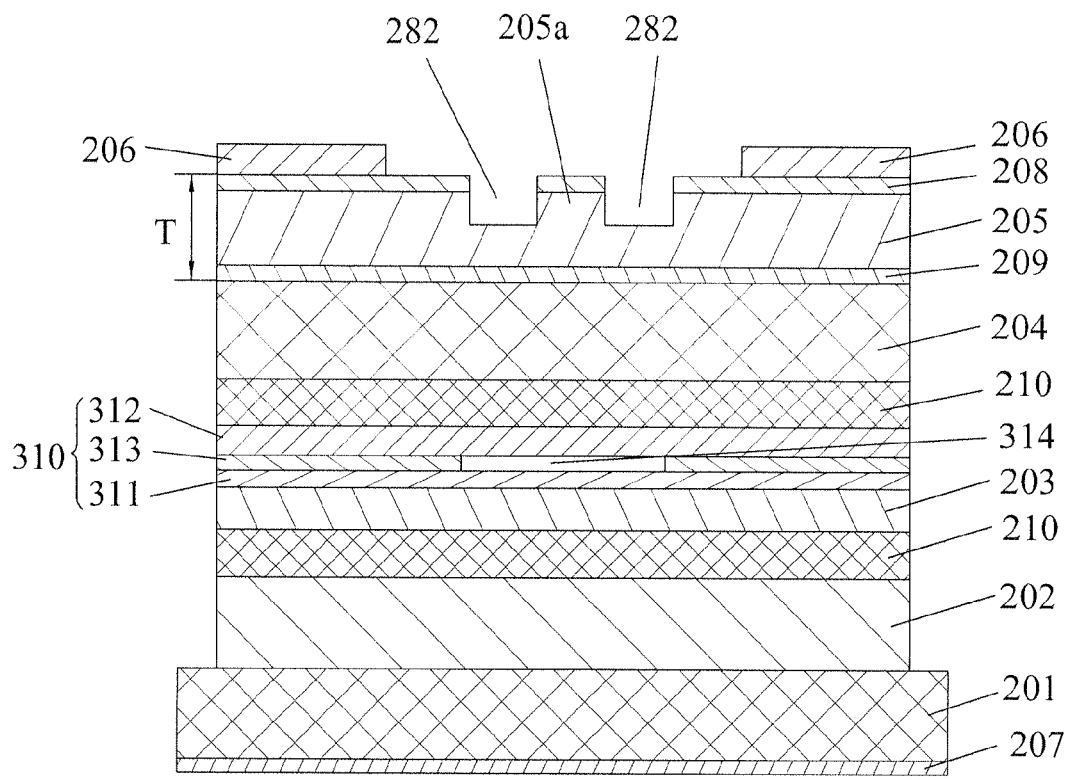
FIG. 5a is a cross-sectional view of a VCSEL device according to a fourth embodiment of the present invention.
Figure 5B:
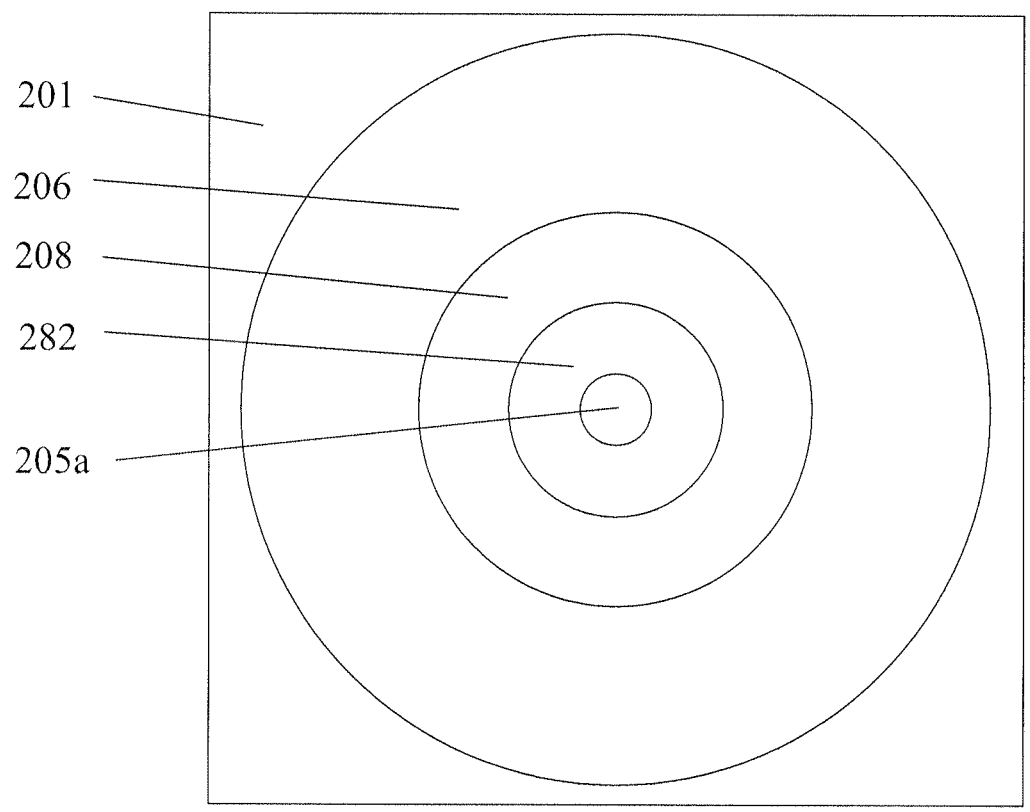
Figure 5C:
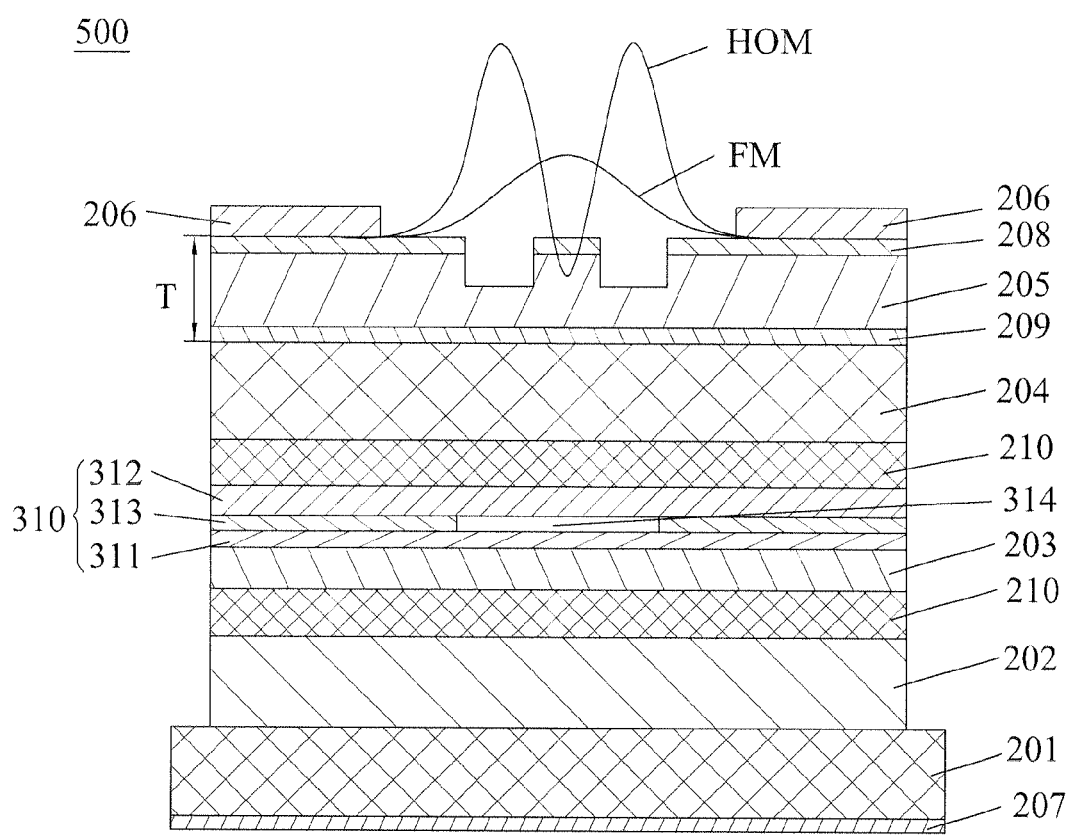

FIG. 5a is a cross-sectional view of a VCSEL device 500 according to a fourth embodiment of the present invention. FIG. 5b is a plan view of the VCSEL device 500 shown in FIG. 5a. The VCSEL device 500 of the present invention is similar to the VCSEL device 400 described above, except minor changes.

In this embodiment, the surface relief structure includes at least one annular groove 282 surrounding a central portion 205a of the surfaces of the contact layer 208 and the first heat dissipation layer 205. Preferably, two annular grooves 282 are etched. The etching depth of the annular groove 282 is in a range of $0.02\lambda$~$0.25\lambda$, and the etching width of the annular groove 282 is in a range of 1 μm to 6 μm. When the annular grooves 282 are etched at the center of the contact window with groove inner diameters nearly 3 μm, thus HOM will be efficiently reflected. In other words, the FM will be less reflected, thus mode partition noise is reduced to improve encircled flux.

Figure 6A:
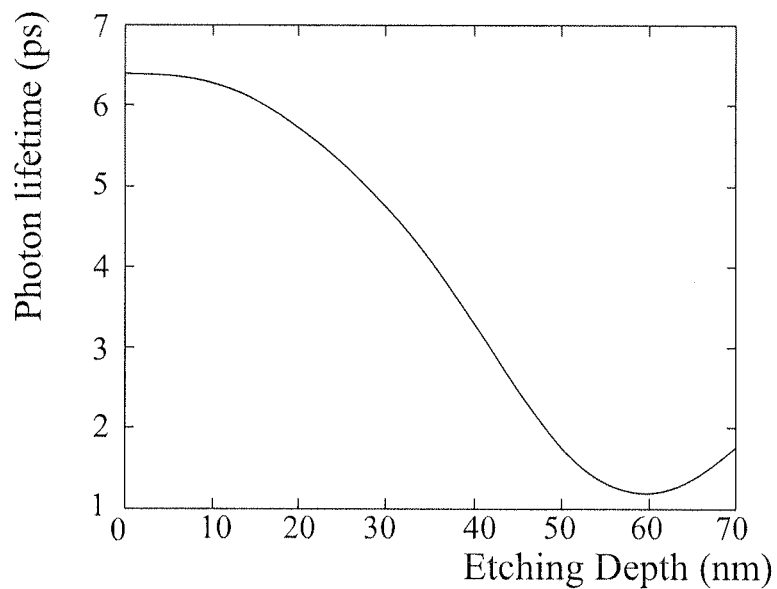
FIG. 6a shows relationship between the etching depth of the central notch or the annular groove and the photon lifetime.
Figure 6B:
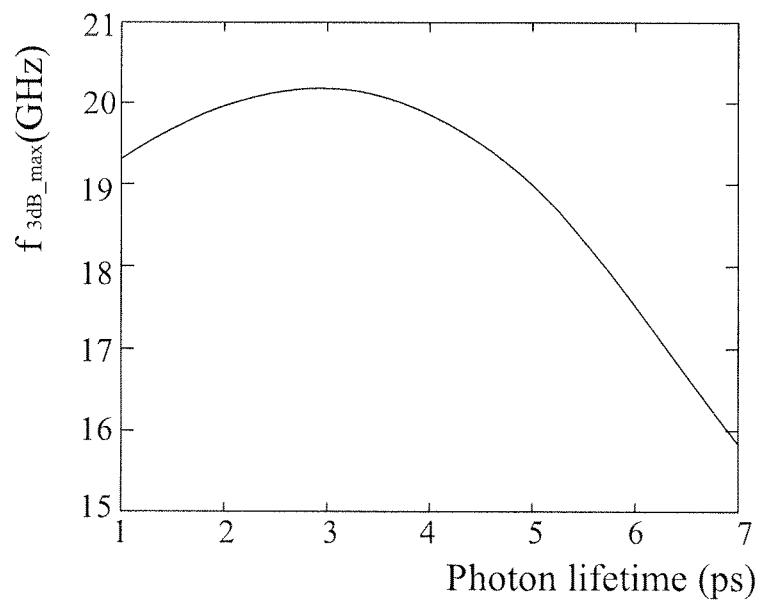
FIG. 6b shows relationship between the photo lifetime between the output bandwidth of the VCSEL device.

Furthermore, the size of the central notch 281 or the annular groove 282 affects the photon lifetime and the output bandwidth of the VCSEL device correlatively. FIG. 6a shows relationship between the etching depth of the central notch 281 or the annular groove 282 and the photon lifetime, and FIG. 6b shows relationship between the photo lifetime and the output bandwidth of the VCSEL device. As illustrated, for a 850 nm VCSEL emission wavelength with in-phase top contact window, the photon lifetime decreases from 6.8 ps to 1.2 ps with the etching depth is increased in a range of 0~60 nm, and with the decreasing of he photon lifetime, the bandwidth of the VCSEL device 500 is increased. In conclusion, when transverse modes are transmitting on the area having the surface relief structure with optimized depth and diameter, reflectivity of the modes will change, the photon lifetime is effectively reduced, and in turns, the output bandwidth of the VCSEL device 500 is increased for high-speed operations. At the same time, the spectral line width of VCSEL device 500 is reduced at a particular surface relief optimized structure, which greatly helps to increase signal transmission to longer distances. This concept is scaled to 1060 nm VCSELs where the etch depth is 0-80 nm.

Figure 7A:
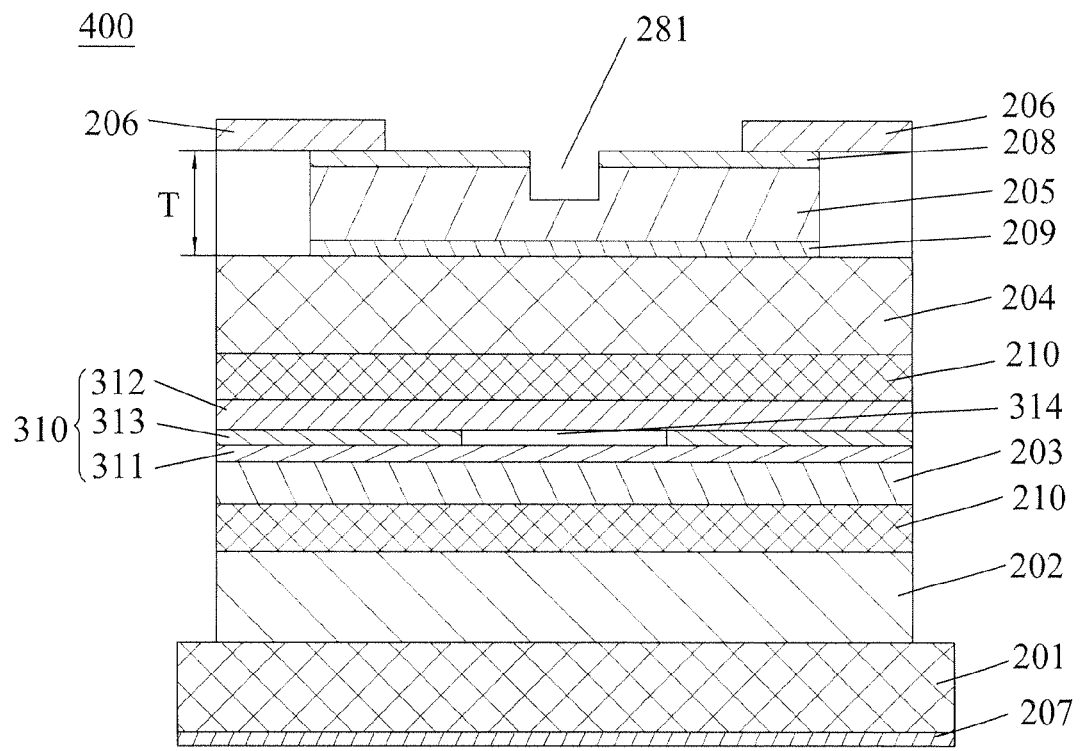
Figure 7B:
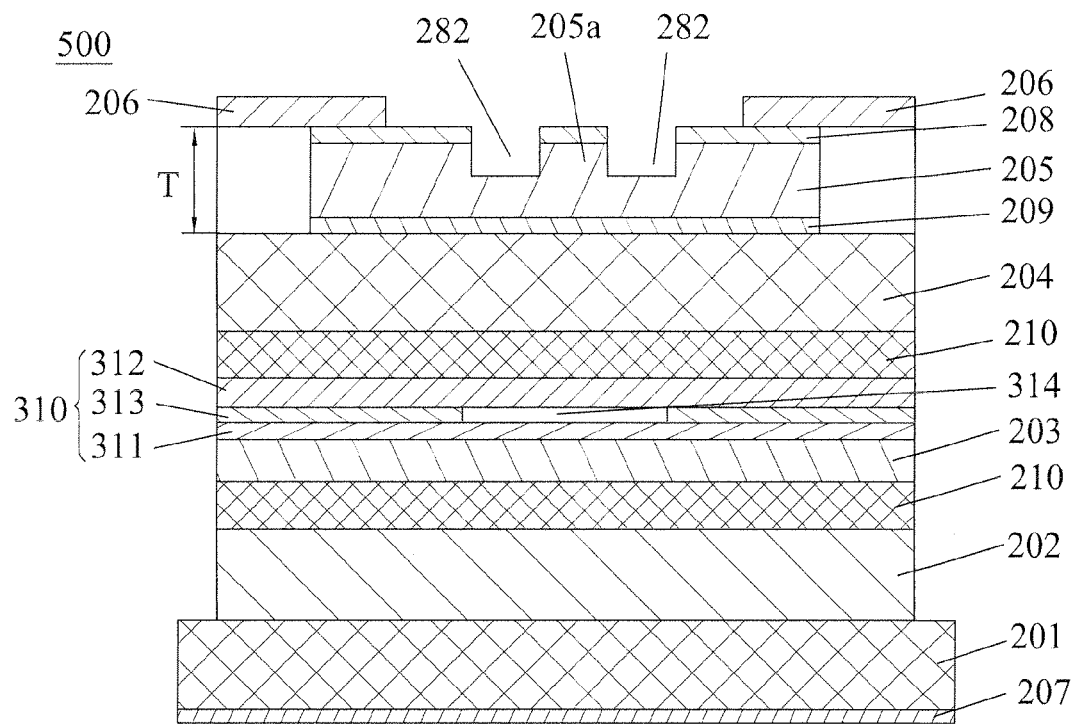

FIGS. 7a and 7b shows two improved embodiments based on the embodiments shown in FIGS. 4a and 4a. In the embodiments, peripheral portions of the contact layer 208, the first heat dissipation layer 205 and the graded index layer 209 are removed by etching. Based on the arrangement, uniform current will be injected to the second window 314 of the current limiting layer 313, thus uniform higher order transverse modes injection can be achieved and threshold current density for the higher order transverse modes is reduced. As a result, the higher order transverse modes would be most efficiently reflected while fundamental mode will be less reflected.

Figure 8:
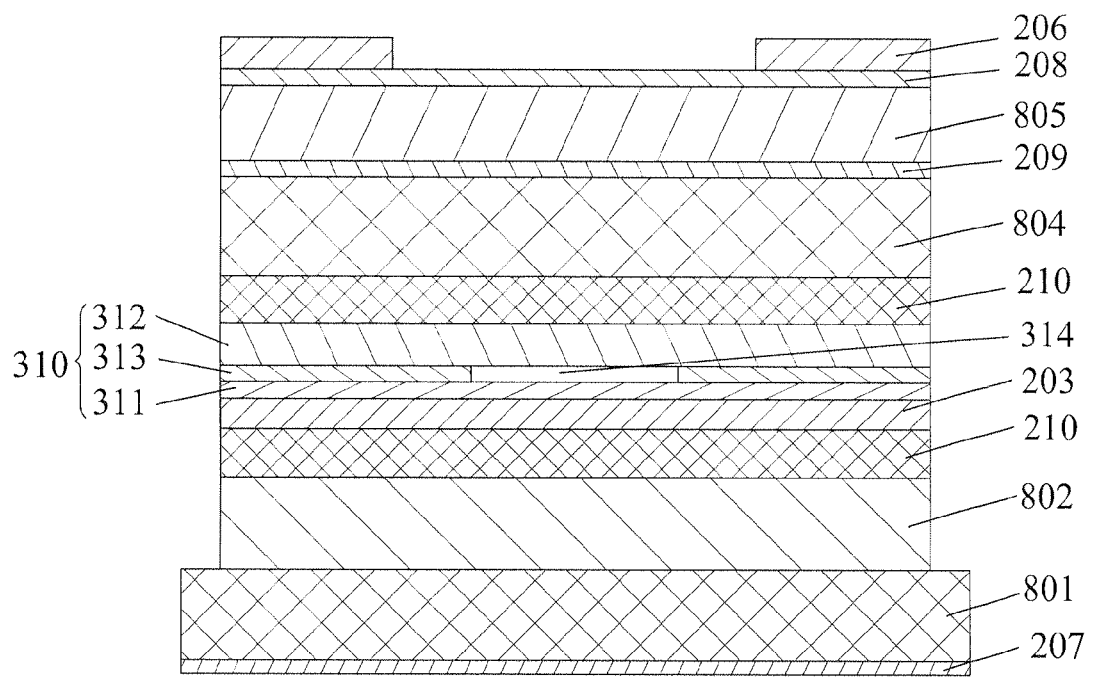
FIG. 8 is cross-sectional view of a VCSEL device according to one embodiment of the present invention.

FIG. 8 is cross-sectional view of a VCSEL device according to one embodiment of the present invention. Contrarily to the VCSEL device 200 in the second embodiment, the VCSEL device 800 here has an opposite doping polarity. The substrate 801 p-type GaAs doped with silicon. The bottom DBR 802 is a p-type reflector and the top DBR 804 is an n-type reflector. And the first heat dissipation layer 805 is made of $n^+$-$Al_xGa_{1-x}As$, such as $n^+$-$Al_{0.05}Ga_{0.09}As$ in the embodiment of 850 nm emission wavelength. The other layers also have an opposite doping polarity compared by the VCSEL device 200 of the second embodiment. Optionally, the substrate 801 can also be un-doped (semi-insulating) GaAs. In this case the bottom electrode layer 207 can also be made present on the top side.

Figure 9A:
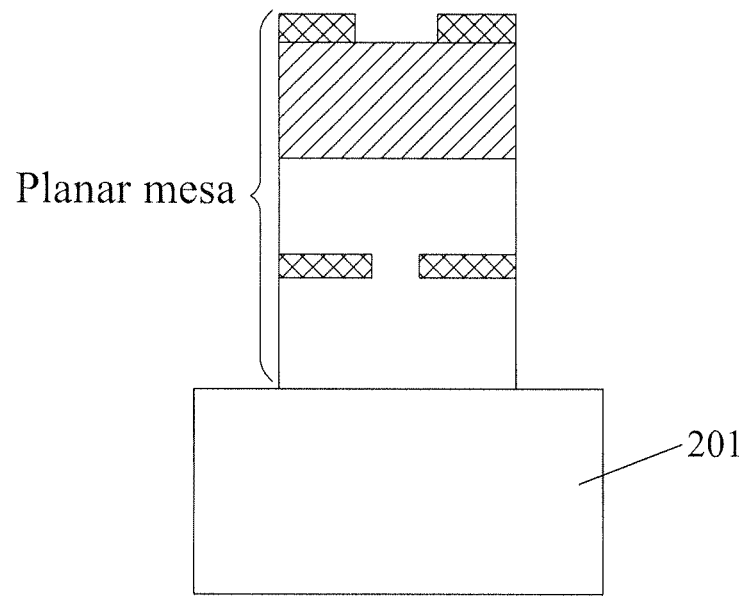
FIGS. 9a, 9b, 9c and 9d show four optional configurations of the VCSEL device according to the present invention.
Figures 9B, 9C, 9D:
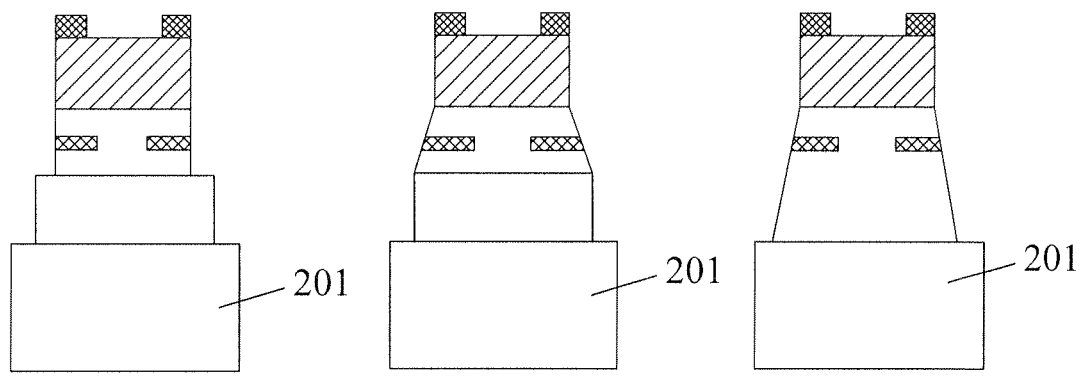

In the present invention, shapes of the stacked layers (called mesa structure commonly) except for the substrate 201 they mounted are optional. FIGS. 9a, 9b, 9c and 9d show fourth optional configurations of the VCSEL device according to the present invention, which shows simplified views, where FIG. 9a represents a planar mesa, and FIG. 9b-9c represent non-planar mesa geometries.

As mentioned above, the VCSEL device of the present invention is applicable to wide predetermined emission wavelengths used for optical communication such as 780 nm, 850 nm, 980 nm, 1060 nm, 1310 nm, 1550 nm included, and emission wavelengths 850 nm and 1060 nm are particularly explained in the embodiments above. Table 1 shows compositions/materials of the main layers of the VCSEL device of different wavelengths, which are included within the spirit and scope of the invention.

TABLE 1

| Emission wavelength | Heat Dissipation layer | active layer | n-DBR | p-DBR | Heavily doped Contact layers |
|---|---|---|---|---|---|
| 850 nm | $p^+$ $Al_{0.05}Ga_{0.95}As$ | GaAs/AlGaAs | AlGaAs/AlGaAs | AlGaAs/AlGaAs | GaAs |
| 780 nm | AlGaAs | GaAsP | AlGaAs/AlAs | AlGaAs/AlAs | AlGaAs |
| 980 nm | GaAs | InGaAs | GaAs/AlAs | GaAs/AlAs | GaAs |
| 1060 nm | GaAs | InGaAs | GaAs/AlAs | GaAs/AlAs | GaAs |
| 1310 nm | AlGaAs AlGaAs InGaAs | InGaAsP or InAs (QD) or GaInNAs | InP/InGaAs(P) GaAs/AlAs | InP/InGaAs(P) GaAs/AlAs | InGaAs |
| 1550 nm | InGaAs | InGaAs(P) | InP/InGaAs(P) | InP/InGaAs(P) | InGaAs |

Figure 10:
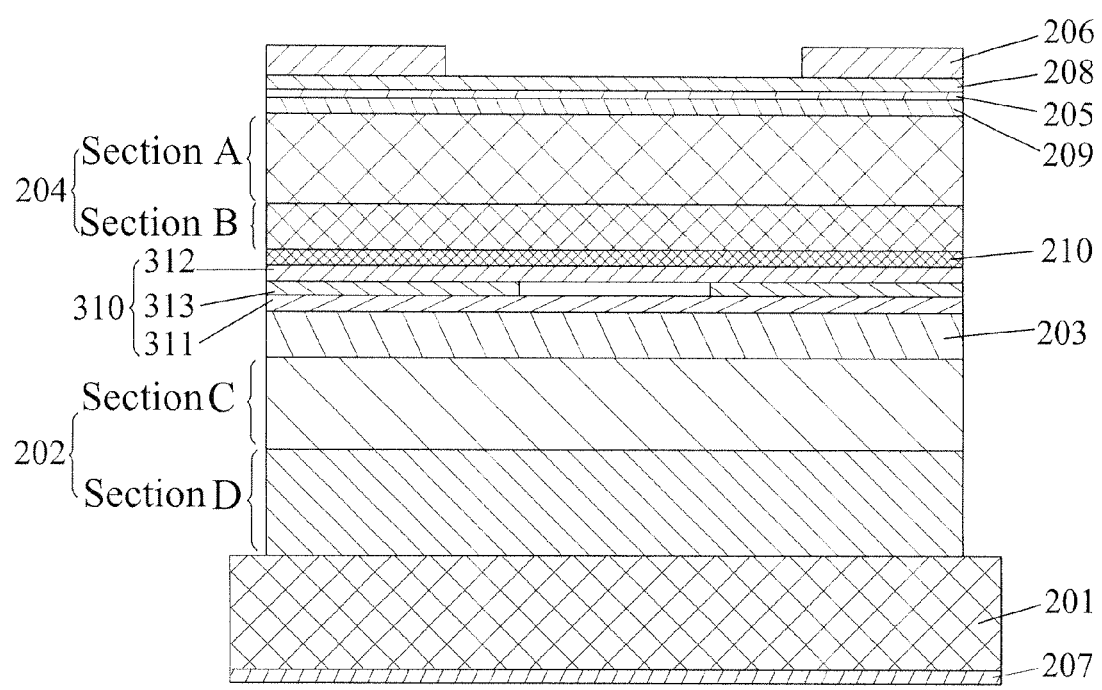
FIG. 10 is cross-sectional view of a VCSEL device according to another embodiment of the present invention.

As a preferable embodiment, as illustrated in FIG. 10, the predetermined emission wavelength is 850 nm, the top DBR 204 includes a first section (so-called section A, thereinafter) formed of multiple pairs, each of which is stacked by a low refractive index layer of $Al_xGa_{1-x}As$ ($0.90 \leq x \leq 0.92$) and a high refractive index layer of $Al_xGa_{1-x}As$ layer ($0.05 \leq x \leq 0.15$); and a second section (so-called section B, thereinafter) formed of multiple pairs, each of which is stacked by a low refractive index layer of $Al_xGa_{1-x}As$ ($0.90 \leq x \leq 1.0$) and a high refractive index layer of $Al_xGa_{1-x}As$ layer ($0.05 \leq x \leq 0.15$). The bottom DBR 202 includes a first section (so-called section C, thereinafter) formed of multiple pairs, each of which is stacked by a low refractive index layer of $Al_xGa_{1-x}As$ ($0.90 \leq x \leq 0.92$) and a high refractive index layer of $Al_xGa_{1-x}As$ layer ($0.05 \leq x \leq 0.15$); and a second section (so-called section D, thereinafter) formed of multiple pairs, each of which is stacked by a low refractive index layer of $Al_xGa_{1-x}As$ ($0.90 \leq x \leq 0.92$) and a high refractive index layer of $Al_xGa_{1-x}As$ layer ($0.05 \leq x \leq 0.15$).

An another embodiment, when the predetermined emission wavelength is 1060 nm, the top DBR 204 includes a first section (section A) formed of multiple pairs, each of which is stacked by a low refractive index layer of $Al_xGa_{1-x}As$ ($0.90 \leq x \leq 0.92$) and a high refractive index layer of $Al_xGa_{1-x}As$ layer ($0 \leq x \leq 0.12$); and a second section (section B) formed of multiple pairs, each of which is stacked by a low refractive index layer of $Al_xGa_{1-x}As$ ($0.91 \leq x \leq 1.0$) and a high refractive index layer of $Al_xGa_{1-x}As$ layer ($0 \leq x \leq 0.12$). The bottom DBR 202 includes a first section (section C) formed of multiple pairs, each of which is stacked by a low refractive index layer of $Al_xGa_{1-x}As$ ($0.90 \leq x \leq 0.92$) and a high refractive index layer of $Al_xGa_{1-x}As$ layer ($0 \leq x \leq 0.12$); and a second section (section D) formed of multiple pairs, each of which is stacked by a low refractive index layer of $Al_xGa_{1-x}As$ ($0.90 \leq x \leq 1.0$) and a high refractive index layer of $Al_xGa_{1-x}As$ layer ($0.0 \leq x \leq 0.12$).

Concretely, the number of pairs of the top DBR 204 or the bottom DBR 202 is optional, which is in a range from 2 to 40, or even higher.

By Adjusting the x values in $Al_xGa_{1-x}As$ in the DBRs 204, 202 of 850 nm and 1060 nm VCSEL, heat dissipation of the VCSEL is effective, comparing with the conventional one, and table 2A and 2B show such a comparison. Theoretical estimates show that, for VCSELs with 850 nm emission wavelengths, it helps to effectively dissipate 23-95% heat from the active region through DBRs 204, 202 as a heat sink for stable operations at higher ambient temperatures. For VCSELs with 1060 m emission wavelength, it helps to effectively dissipate 60-105% heat from the active region through DBRs 204, 202 as a heat sink for stable operations at higher ambient temperatures. Particularly, the heat dissipation efficiency could be further improved by thickening the heat dissipation window (consisting of layers 205, 209, 208). Moreover, oxide capacitance of DBRs 204, 202 will be reduced in both of 850 nm and 1060 nm VCSELs, thereby increasing modulation speed of the VCSELs.

TABLE 2A

Improved thermal impedance with adjusted Al mole fractions at 850 nm VCSEL

| Emission wavelength | | x value in $Al_xGa_{1-x}As$ (amount of pairs in DBR) | | | | Relative Heat Dissipation |
|---|---|---|---|---|---|---|
| | | Section A | Section B | Section C | Section D | Factor |
| 850 nm | Conventional | 0.15~0.9 (21) | 0.15~1.0 (2) | 0.15~0.9 (4) | 0.15~0.9 (29) | 1.00 |
| | Invention | 0.12~0.9 (21) | 0.12~1.0 (2) | 0.12~0.9 (4) | 0.12~0.9 (29) | 1.23 |
| | | 0.10~0.9 (21) | 0.10~1.0 (2) | 0.10~0.9 (4) | 0.10~0.9 (29) | 1.36 |
| | | 0.05~0.92 (21) | 0.05~1.0 (2) | 0.05~0.92 (4) | 0.05~0.92 (29) | 1.95 |

TABLE 2B

Improved thermal impedance with adjusted Al mole fractions at 1060 nm VCSEL

| Emission wavelength | | x value in $Al_xGa_{1-x}As$ (amount of pairs in DBR) | | | | Relative Heat Dissipation |
|---|---|---|---|---|---|---|
| | | Section A | Section B | Section C | Section D | Factor |
| 1060 nm | Conventional | 0.12~0.9 (18) | 0.12~1.0 (2) | 0.12~0.9 (5) | 0.12~0.9 (33) | 1.00 |
| | Invention | 0.05~0.92 (18) | 0.05~1.0 (2) | 0.05~0.92 (5) | 0.05~0.92 (33) | 1.60 |
| | | 0.0~0.92 (18) | 0.0~1.0 (2) | 0.0~0.92 (5) | 0.0~0.92 (33) | 2.03 |
| | | 0.0~0.92 (18) | 0.0~1.0 (2) | 0.0~0.92 (5) | 0.0~1.0 (33) | 2.05 |

A method of manufacturing VCSEL device according to one embodiment of the present invention will be now described (referring to FIG. 2). First, n-type multilayer film (a multilayer film in which n-type $Al_xGa_{1-x}As$ with different ratios are alternately stacked), which is to be the bottom DBR 202, GaAs and AlGaAs stacked layer, which is to be the active layer 203, p-type multilayer film in which p-type $Al_xGa_{1-x}As$ with different ratios are alternately stacked, which is to be the top DBR 204, and $p^+GaAs$ film, which is to be the first heat dissipation layer 205, are successively formed on n-type GaAs substrate 201. Mesa structure consisting of the bottom DBR 202, active layer 203, top DBR 204, first heat dissipation layer 205, is formed by means of epitaxial or metal organic chemical vapor deposition. And anode electrode 206 and cathode electrode 207 are formed on the top of the mesa structure where the first heat dissipation layer 205 is exposed and on the back surface of the substrate 201, respectively, by means of vapor deposition or thermal evaporation.

The present invention provides a first heat dissipation layer 205 sandwiched between the top DBR 204 and the top electrode 206, thus heat present on the top electrode 206 due to long durations of applied current, and heat congregated on the top side of the VCSEL device, especially on the top surface of the top DBR 204 will be dissipated efficiently. As a result, a lower junction temperature of VCSEL device is maintained, thereby achieving stable operation at high ambient temperature, which improves the performance of the VCSEL device greatly.

Preferably, referring to FIGS. 3-5b, the method further includes etching the surface relief structure on a surface of the first heat dissipation layer 205. The surface relief structure can be a central notch 281 on a center of the surface of the first heat dissipation layer 205, or at least one annular groove 282 surrounding a central portion of the surface of the first heat dissipation layer 205, which is described in above embodiments in detailed.

Preferably, the method further includes forming a contact layer 208 formed between the top electrode 206 and heat dissipation layer, and a graded index layer 209 formed between the top distributed Bragg reflector and the first heat dissipation layer 205. The total thickness T of the first heat dissipation layer 205, the contact layer 208 and the graded index layer 209, is satisfied the relationship below: $T=n*(1/4)\lambda$, where $\lambda$ being the emission wavelength.

The method includes all corresponding technical features of the VCSEL device described above, and obtains the same or corresponding technical effect achieved in the VCSEL device embodiments, which could be understood by persons skilled in the art when read through the description recited in the embodiments above, thus is omitted here.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A vertical cavity surface emitting laser device comprising:
    a bottom distributed Bragg reflector;
    a top distributed Bragg reflector;
    an active layer formed between the bottom distributed Bragg reflector and the top distributed Bragg reflector, arranged for generating laser light with a predetermined emission wavelength;
    at least one oxide section formed between top distributed Bragg reflector and active layer;
    a top electrode layer with a first window exposed formed above the top distributed Bragg reflector;
    a first heat dissipation layer sandwiched between the top distributed Bragg reflector and the top electrode layer; and
    a contact layer formed between the top electrode layer and the first heat dissipation layer, and a graded index layer formed between the top distributed Bragg reflector and the first heat dissipation layer.

2. The vertical cavity surface emitting laser device according to claim 1, wherein the first heat dissipation layer comprises one or more material(s) selected from a group consisting of Aluminum Arsenide, Gallium Arsenide, and Indium Phosphide.

3. The vertical cavity surface emitting laser device according to claim 2, further comprising a surface relief structure which includes a central notch formed on a center of the surface of the first heat dissipation layer.

4. The vertical cavity surface emitting laser device according to claim 2, further comprising a surface relief structure which includes at least one annular groove surrounding a central portion of the surface of the first heat dissipation layer.

5. The vertical cavity surface emitting laser device according to claim 3, wherein the depth of the central notch is in a range of $0.02\lambda$ to $0.25\lambda$, where $\lambda$ is the emission wavelength of the laser light in vacuum; and the diameter of the central notch is in a range of 1 μm to 6 μm.

6. The vertical cavity surface emitting laser device according to claim 4, wherein the depth of the annular groove is in a range of $0.02\lambda$ to $0.25\lambda$, where $\lambda$ is the emission wavelength of the laser light in vacuum; and the width of the annular groove is in a range of 1 μm to 6 μm.

7. The vertical cavity surface emitting laser device according to claim 1, wherein a relationship below is satisfied:

$$T=n*(1/4)\lambda;$$

where $\lambda$ is the emission wavelength of the laser light in vacuum, T is a total thickness of the first heat dissipation layer, the contact layer and the graded index layer, and n is a natural number.

8. The vertical cavity surface emitting laser device according to claim 1, peripheral portions of the contact layer, the first heat dissipation layer and the graded index layer are removed by etching.

9. The vertical cavity surface emitting laser device according to claim 1, wherein the oxide section comprises at least two phase matching layers and a current limiting layer sandwiched between the top distributed Bragg reflector and the active layer.

10. The vertical cavity surface emitting laser device according to claim 9, wherein a second window is opened on the current limiting layer and the diameter of the second window is of the order of the diameter of the first window.

11. The vertical cavity surface emitting laser device according to claim 1, further comprising a second heat dissipation layer formed between the active layer and the bottom distributed Bragg reflector, or between the active layer and the top distributed Bragg reflector.

12. The vertical cavity surface emitting laser device according to claim 1, wherein the bottom distributed Bragg reflector is n-type doping reflector or p-type doping reflector, and the top distributed Bragg reflector has an opposite polarity doping reflector.

13. The vertical cavity surface emitting laser device according to claim 1, wherein the predetermined emission wavelength comprises 780 nm, 850 nm, 980 nm, 1060 nm, 1330 nm, or 1550 nm.

14. The vertical cavity surface emitting laser device according to claim 1, further comprising a substrate which is made of doped or un-doped materials formed beneath the bottom distributed Bragg reflector.

15. The vertical cavity surface emitting laser device according to claim 1, wherein the predetermined emission wavelength comprises 850 nm, and
the top distributed Bragg reflector comprises:
a first section A formed of multiple pairs, each of which is stacked by a low refractive index layer of $Al_xGa_{1-x}As$ ($0.90 \leq x \leq 0.92$) and a high refractive index layer of $Al_xGa_{1-x}As$ layer ($0.05 \leq x \leq 0.15$); and
a second section B formed of multiple pairs, each of which is stacked by a low refractive index layer of $Al_xGa_{1-x}As$ ($0.90 \leq x \leq 1.0$) and a high refractive index layer of $Al_xGa_{1-x}As$ layer ($0.05 \leq x \leq 0.15$);
the bottom distributed Bragg reflector comprises:
a first section C formed of multiple pairs, each of which is stacked by a low refractive index layer of $Al_xGa_{1-x}As$ ($0.90 \leq x \leq 0.92$) and a high refractive index layer of $Al_xGa_{1-x}As$ layer ($0.05 \leq x \leq 0.15$); and
a second section D formed of multiple pairs, each of which is stacked by a low refractive index layer of AlxGa1-xAs ($0.90 \leq x \leq 0.92$) and a high refractive index layer of AlxGa1-xAs layer ($0.05 \leq x \leq 0.15$).

16. The vertical cavity surface emitting laser device according to claim 1, wherein the predetermined emission wavelength comprises 1060 nm,
and the top distributed Bragg reflector comprises:
a first section A formed of multiple pairs, each of which is stacked by a low refractive index layer of $Al_xGa_{1-x}As$ ($0.90 \leq x \leq 0.92$) and a high refractive index layer of $Al_xGa_{1-x}As$ layer ($0 \leq x \leq 0.12$); and
a second section B formed of multiple pairs, each of which is stacked by a low refractive index layer of AlxGa1-xAs ($0.91 \leq x \leq 1.0$) and a high refractive index layer of AlxGa1-xAs layer ($0 \leq x \leq 0.12$);
the bottom distributed Bragg reflector comprises:
a first section C formed of multiple pairs, each of which is stacked by a low refractive index layer of $Al_xGa_{1-x}As$ ($0.90 \leq x \leq 0.92$) and a high refractive index layer of $Al_xGa_{1-x}As$ layer ($0 \leq x \leq 0.12$); and
a second section D formed of multiple pairs, each of which is stacked by a low refractive index layer of $Al_xGa_{1-x}As$ ($0.90 \leq x \leq 1.0$) and a high refractive index layer of $Al_xGa_{1-x}As$ layer ($0.0 \leq x \leq 0.12$).

* * * * *